(12) United States Patent
Senoo et al.

(10) Patent No.: US 11,315,640 B2
(45) Date of Patent: Apr. 26, 2022

(54) SEMICONDUCTOR DEVICE AND CONTINUOUS READING METHOD

(71) Applicant: Winbond Electronics Corp., Taichung (TW)

(72) Inventors: Makoto Senoo, Kanagawa (JP);
Katsutoshi Suito, Kanagawa (JP);
Tsutomu Taniguchi, Kanagawa (JP);
Sho Okabe, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 71 days.

(21) Appl. No.: 16/931,383

(22) Filed: Jul. 16, 2020

(65) Prior Publication Data
US 2021/0034304 A1 Feb. 4, 2021

(30) Foreign Application Priority Data
Jul. 29, 2019 (JP) ............... JP2019-138606

(51) Int. Cl.
| | | |
|---|---|---|
| G11C 7/00 | (2006.01) |
| G11C 16/26 | (2006.01) |
| G06F 3/06 | (2006.01) |
| G06F 12/0844 | (2016.01) |
| G11C 7/10 | (2006.01) |

(52) U.S. Cl.
CPC ............ *G11C 16/26* (2013.01); *G06F 3/0604* (2013.01); *G06F 3/0655* (2013.01); *G06F 3/0679* (2013.01); *G06F 12/0844* (2013.01); *G11C 7/106* (2013.01); *G06F 2212/60* (2013.01)

(58) Field of Classification Search
CPC ....... G11C 7/1051; G11C 7/1078; G11C 7/22; G11C 7/106; G11C 7/1057
USPC ....................... 365/189.05, 189.15
See application file for complete search history.

(56) References Cited

U.S. PATENT DOCUMENTS

| | | | |
|---|---|---|---|
| 10,720,207 B2 * | 7/2020 | Cho ................ G11C 16/24 |
| 2013/0297987 A1 | 11/2013 | Gupta et al. |
| 2014/0010020 A1 | 1/2014 | Fukuda |
| 2014/0104947 A1 | 4/2014 | Yamauchi et al. |

(Continued)

FOREIGN PATENT DOCUMENTS

| | | |
|---|---|---|
| CN | 101165807 | 5/2012 |
| JP | 2000020409 | 1/2000 |
| JP | 2001184874 | 7/2001 |

(Continued)

OTHER PUBLICATIONS

"Office Action of Japan Counterpart Application", dated Jan. 20, 2021, p. 1-p. 4.

(Continued)

*Primary Examiner* — Son T Dinh
(74) *Attorney, Agent, or Firm* — JCIPRNET (57) ABSTRACT

A continuous reading method of a flash memory is provided, including: after outputting data held in a cache memory (C0) of a latch (L1) of a page buffer/sensing circuit, data of the cache memory (C0) of a next page is read from a memory cell array, and the read data of the cache memory (C0) is held in the latch (L1). After outputting data held in the cache memory (C1) of the latch (L1), data of the same next page of the cache memory (C1) is read from the memory cell array, and the read data of the cache memory (C1) is held in the latch (L1).

10 Claims, 10 Drawing Sheets

(56) References Cited

U.S. PATENT DOCUMENTS

2018/0130534 A1    5/2018  Kojima
2019/0188126 A1*   6/2019  Chun ................ G11C 11/5635

FOREIGN PATENT DOCUMENTS

| JP | 2007305284  | 11/2007 |
| JP | 5323170     | 10/2013 |
| JP | 2013235642  | 11/2013 |
| JP | 5667143     | 2/2015  |
| JP | 2018073448  | 5/2018  |
| KR | 20180050218 | 5/2018  |
| TW | I552155     | 10/2016 |

OTHER PUBLICATIONS

"Office Action of Japan Counterpart Application", dated Sep. 30, 2020, pp. 1-5.
"Office Action of Japan Counterpart Application", dated Apr. 28, 2021, p. 1-p. 5.
Office Action of Korea Counterpart Application, with English translation thereof, dated May 24, 2021, pp. 1-7.

\* cited by examiner

FIG. 1A

Definition of cache memory : C0=C0_M+C0_S、 C1=C1_M+C1_S

| Page buffer/sensing circuit | Sub-bit line | Global bit line (GBL_e/GBL_o) |
|---|---|---|
| PB<0> (C0) | SBL<0> | GBL<0, 1> |
| PB<4> (C1) | SBL<1> | GBL<2, 3> |
| PB<1> (C0) | SBL<2> | GBL<4, 5> |
| PB<5> (C1) | SBL<3> | GBL<6, 7> |
| PB<2> (C0) | SBL<4> | GBL<8, 9> |
| PB<6> (C1) | SBL<5> | GBL<10, 11> |
| PB<3> (C0) | SBL<6> | GBL<12, 13> |
| PB<7> (C1) | SBL<7> | GBL<14, 15> |

| YBC* | | | <*> | YA* | CA (hex) | Cache memory | SBL |
|---|---|---|---|---|---|---|---|
| IY1_PB_SAX16<0> | IY1_PB_SAX8<0> | 0 | IY1_PB_SA 0 | Eb<0> | 0 | 0 | 0 |
| | | | IY1_PB_SA 1 | Eb<1> | 2 | 0 | 2 |
| | | | IY1_PB_SA 2 | Eb<2> | 4 | 0 | 4 |
| | | | IY1_PB_SA 3 | Eb<3> | 6 | 0 | 6 |
| | | 68 | IY1_PB_SA 4 | Eb<0> | 440 | 1 | 1 |
| | | | IY1_PB_SA 5 | Eb<1> | 442 | 1 | 3 |
| | | | IY1_PB_SA 6 | Eb<2> | 444 | 1 | 5 |
| | | | IY1_PB_SA 7 | Eb<3> | 446 | 1 | 7 |
| | IY1_PB_SAX8<1> | 0 | IY1_PB_SA 0 | Eb<4> | 8 | 0 | 8 |
| | | | IY1_PB_SA 1 | Eb<5> | A | 0 | 10 |
| | | | IY1_PB_SA 2 | Eb<6> | C | 0 | 12 |
| | | | IY1_PB_SA 3 | Eb<7> | E | 0 | 14 |
| | | 68 | IY1_PB_SA 4 | Eb<4> | 448 | 1 | 9 |
| | | | IY1_PB_SA 5 | Eb<5> | 44A | 1 | 11 |
| | | | IY1_PB_SA 6 | Eb<6> | 44C | 1 | 13 |
| | | | IY1_PB_SA 7 | Eb<7> | 44E | 1 | 15 |
| IY1_PB_SAX16<1> | IY1_PB_SAX8<0> | 1 | IY1_PB_SA 0 | Ob<0> | 10 | 0 | 16 |
| | | | IY1_PB_SA 1 | Ob<1> | 12 | 0 | 18 |
| | | | IY1_PB_SA 2 | Ob<2> | 14 | 0 | 20 |
| | | | IY1_PB_SA 3 | Ob<3> | 16 | 0 | 22 |
| | | 69 | IY1_PB_SA 4 | Ob<0> | 450 | 1 | 17 |
| | | | IY1_PB_SA 5 | Ob<1> | 452 | 1 | 19 |
| | | | IY1_PB_SA 6 | Ob<2> | 454 | 1 | 21 |
| | | | IY1_PB_SA 7 | Ob<3> | 456 | 1 | 23 |
| | IY1_PB_SAX8<1> | 1 | IY1_PB_SA 0 | Ob<4> | 18 | 0 | 24 |
| | | | IY1_PB_SA 1 | Ob<5> | 1A | 0 | 26 |
| | | | IY1_PB_SA 2 | Ob<6> | 1C | 0 | 28 |
| | | | IY1_PB_SA 3 | Ob<7> | 1E | 0 | 30 |
| | | 69 | IY1_PB_SA 4 | Ob<4> | 458 | 1 | 25 |
| | | | IY1_PB_SA 5 | Ob<5> | 45A | 1 | 27 |
| | | | IY1_PB_SA 6 | Ob<6> | 45C | 1 | 29 |
| | | | IY1_PB_SA 7 | Ob<7> | 45E | 1 | 31 |

FIG. 11

SEMICONDUCTOR DEVICE AND CONTINUOUS READING METHOD

CROSS-REFERENCE TO RELATED APPLICATION

This application claims the priority benefit of Japan application serial no. 2019-138606, filed on Jul. 29, 2019. The entirety of the above-mentioned patent application is hereby incorporated by reference herein and made a part of this specification.

BACKGROUND

Technical Field

The disclosure relates to a semiconductor device, and particularly relates to continuous reading of a flash memory and the like.

Description of Related Art

A NAND flash memory has a continuous reading function (a burst reading function) capable of continuously reading multiple pages in response to an external command. A page buffer/sensing circuit includes, for example, two latches, and in a continuous reading operation, during a period when data read from an array is held in one latch, data held by another latch may be output (for example, patent literatures 1, 2, 3, etc.).

Patent literature 1: Japan Laid-Open No. 5323170
Patent literature 2: Japan Laid-Open No. 5667143
Patent literature 3: U.S. Patent Application No. US 2014/0104947A1

Problems to be Solved by the Disclosure

Figure 1A:
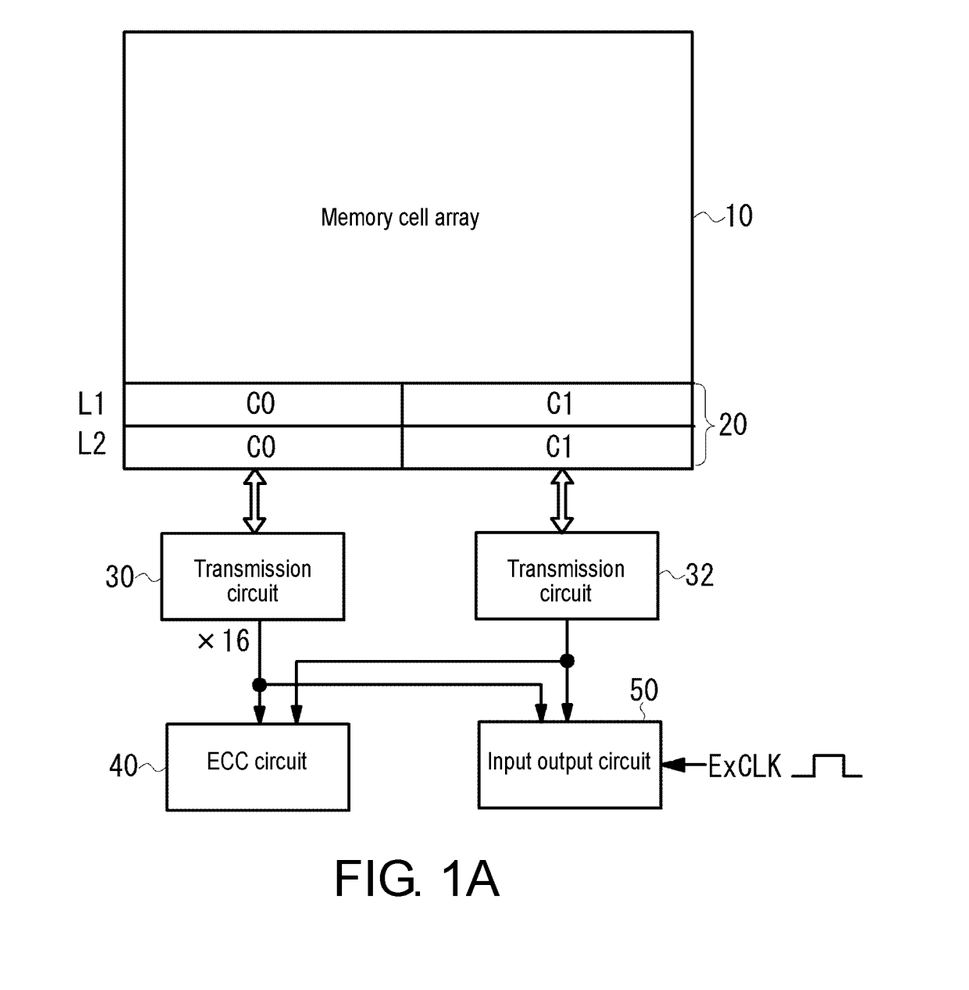
FIG. 1A and FIG. 1B are diagrams of a schematic configuration of a conventional NAND flash memory.
Figure 1B:
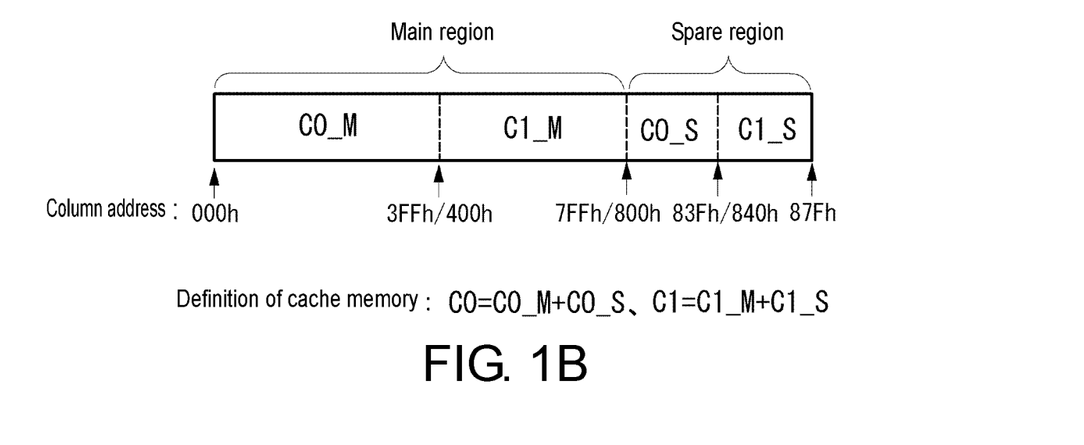

FIG. 1A and FIG. 1B illustrate a schematic configuration of a NAND flash memory equipped with a chip-level error checking and correction (ECC) function. The flash memory includes: a memory cell array 10 including an NAND string, a page buffer/sensing circuit 20, a data transmission circuit 30, a data transmission circuit 32, and an error detection and correction circuit (which is referred to as an ECC circuit hereinafter) 40, and input output circuit 50. The page buffer/sensing circuit 20 includes two latches L1 and L2 (one latch, for example, has 4 KB) holding read data or input data to be programmed, and the latch L1 and the latch L2 respectively include a cache memory C0 and a cache memory C1 (one cache memory, for example, has 2 KB). The cache memory C0 and the cache memory C1 may respectively perform independent operations. In addition, the ECC circuit 40 may be enabled or disabled through user options.

Figure 2:
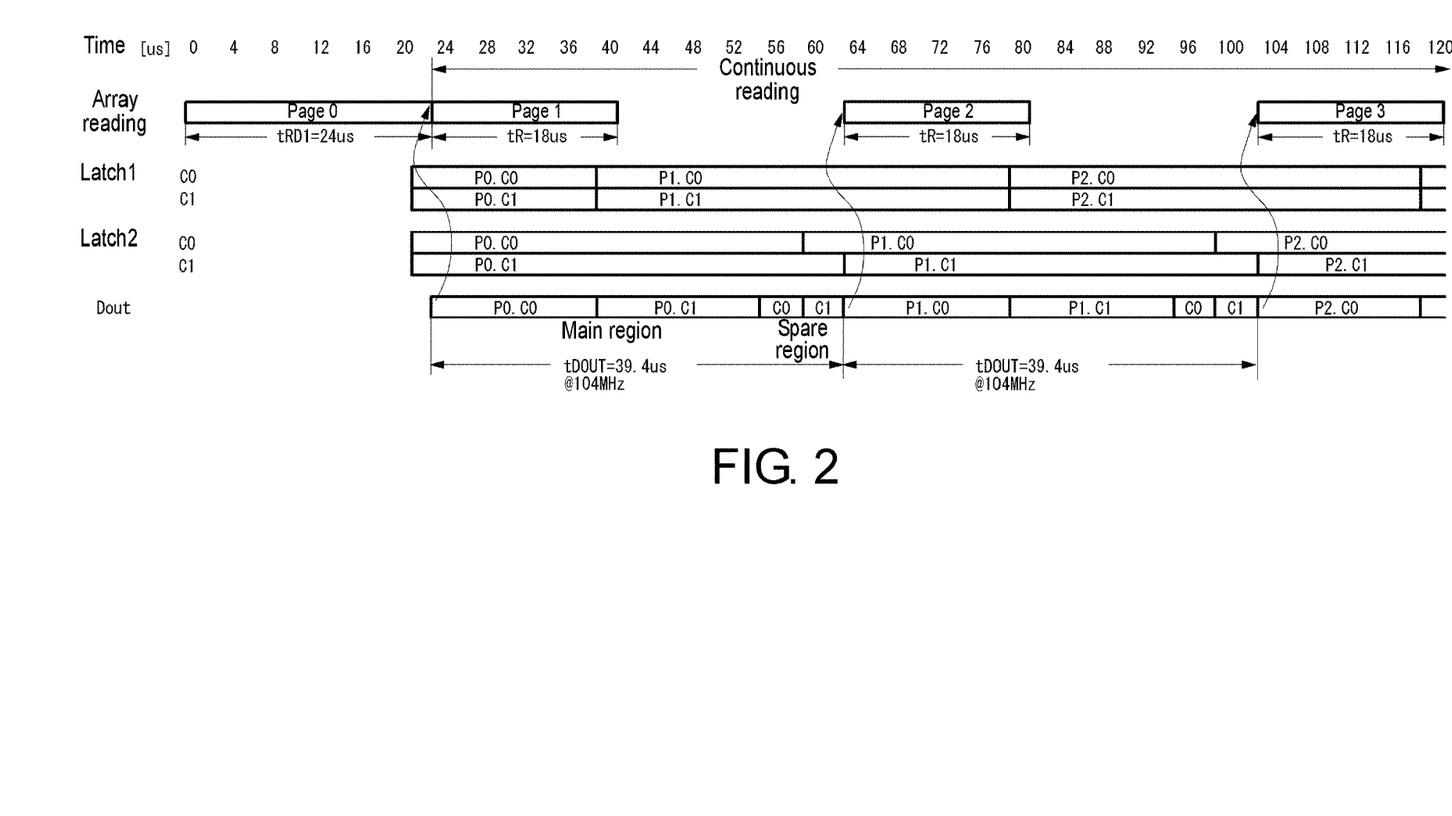
FIG. 2 is a timing diagram of previous continuous reading performed by using a latch L1 and a latch L2.

FIG. 2 is a timing diagram of pervious continuous reading. The continuous reading is to continuously read data from multiple pages, and such operation may be executed through commands. First, array reading of a page P0 (page 0) is performed. At this moment, a reading time tRD1 is about 24 µs. The data of the read page P0 is held in the cache memory C0 and the cache memory C1 (P0.C0, P0.C1) of the latch L1 (latch 1). Then, the data of the cache memory C0 and the cache memory C1 of the latch L1 is transmitted to the cache memory C0 and the cache memory C1 of the latch L2 (latch 2). During a period when one of the cache memory C0 and the cache memory C1 performs data output, the other one performs ECC processing, and during a period when the other one performs data output, this one performs the ECC processing. Moreover, after data is transmitted from the latch L1 to the latch L2, array reading of a next page P1 (page 1) is performed and the read data is held in the latch L1.

In the continuous reading, a row address is automatically and progressively increased, and continuous reading of a plurality of pages is started from the page P1. An array reading time tR in the continuous reading is about 18 µs. The array reading is performed in synchronization with an internal clock signal, and data output of the input output circuit 50 is performed in synchronization with an external clock signal ExCLK which is asynchronous with the internal clock signal. A data output time tDOUT of one page depends on a frequency of the external clock signal ExCLK. For example, when the external clock signal ExCLK is 104 MHz, the data output time tDOUT is about 39.4 µs. In the continuous reading, the array reading time tR must be less than the data output time tDOUT of one page.

The memory cell array 10 includes a main region for storing data, and a spare region for storing error detection codes generated by ECC processing and user information. FIG. 1B shows the main region and the spare region of the memory cell array 10. The main region includes a main part C0_M corresponding to the cache memory C0 and a main part C1_M corresponding to the cache memory C1, a column address of the main part C0_M is 000h-3FFh, and a column address of the main part C1_M is 400h-7FFh. The spare region includes a spare part C0_S corresponding to the cache memory C0 and a spare part C1_S corresponding to the cache memory C1, a column address of the spare part C0_S is 800h-83Fh, and a column address of the spare part C1_S is 840h-87Fh.

The cache memory C0 and the cache memory C1 used by a user are defined by C0=the main part C0_M+the spare part C0_S, C1=the main part C1_M+the spare part C1_S. This user definition is the same as a definition of the flash memory in internal operations. Moreover, the column addresses of the memory cell array are the same as and correspond to the column addresses of the latches L1 and L2 of the page buffer/sensing circuit 20 one-to-one. In the continuous reading operation, the data is sequentially output in an order from the column address 000h to the column address 87Fh.

Figure 3:
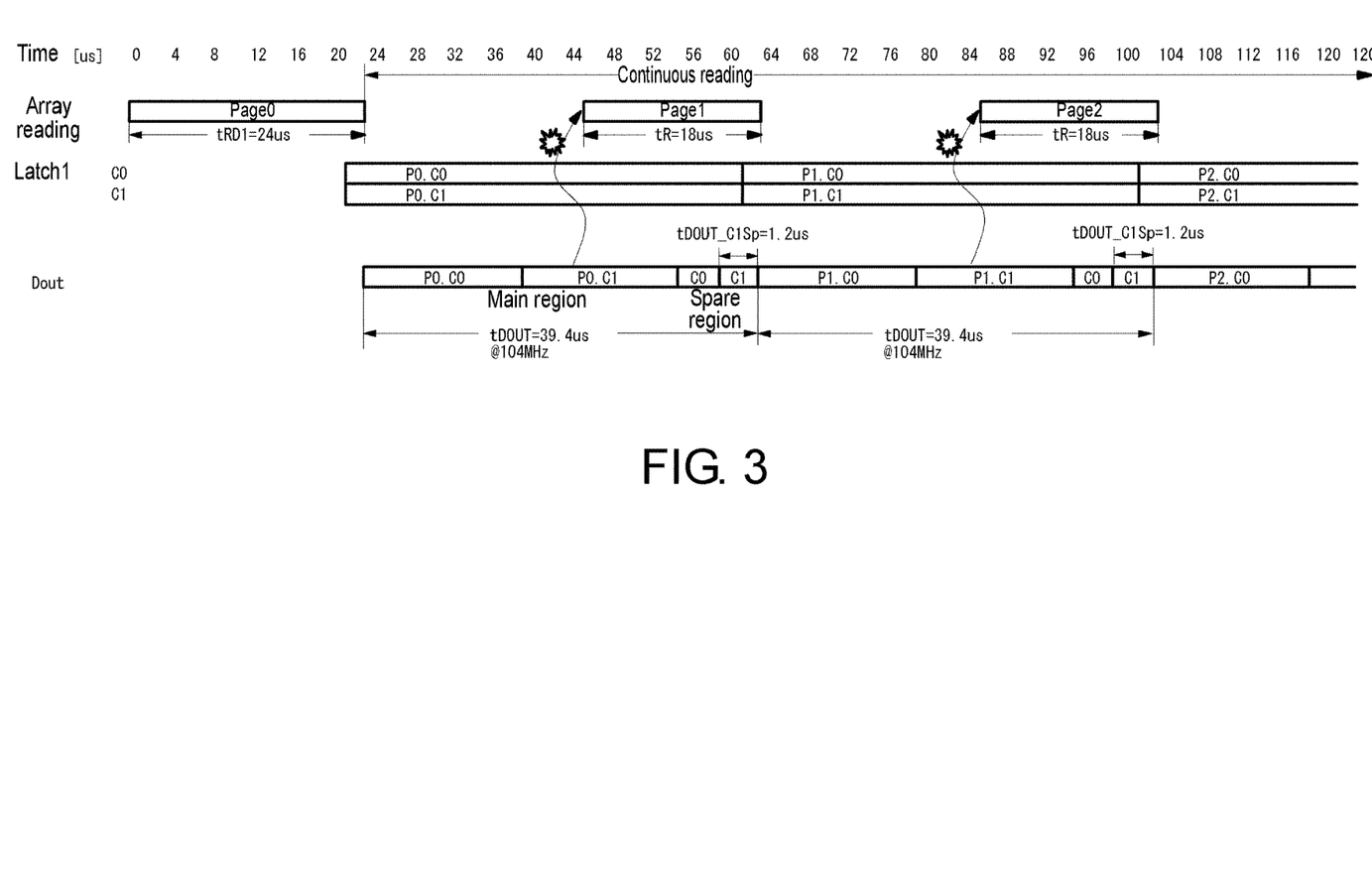
FIG. 3 is a timing diagram of previous continuous reading performed by using the single latch L1.

When a size of one page becomes larger due to high integration, a dedicated area of the page buffer/sensing circuit 20 is enlarged proportionally. If the latch L2 may be removed, the area occupied by the page buffer/sensing circuit 20 may be greatly reduced. FIG. 3 is a timing diagram of continuous reading performed by using the single latch L1 (without the latch L2). In this case, since there is no place to evacuate the data of the latch L1, if the data of the latch L1 is not empty, the array reading cannot be performed. Namely, it is impossible to perform seamless reading.

Therefore, research has been conducted to divide data of one page into two ½ pages of the cache memory C0 and the cache memory C1 for reading. In this case, a same page is read twice, so that there may be an interference caused by the reading operation. Namely, in the reading operation, since all of bit lines are precharged/discharged, an undesirable voltage caused by capacitive coupling between the bit lines may affect the bit lines and the memory cells.

Figure 4:
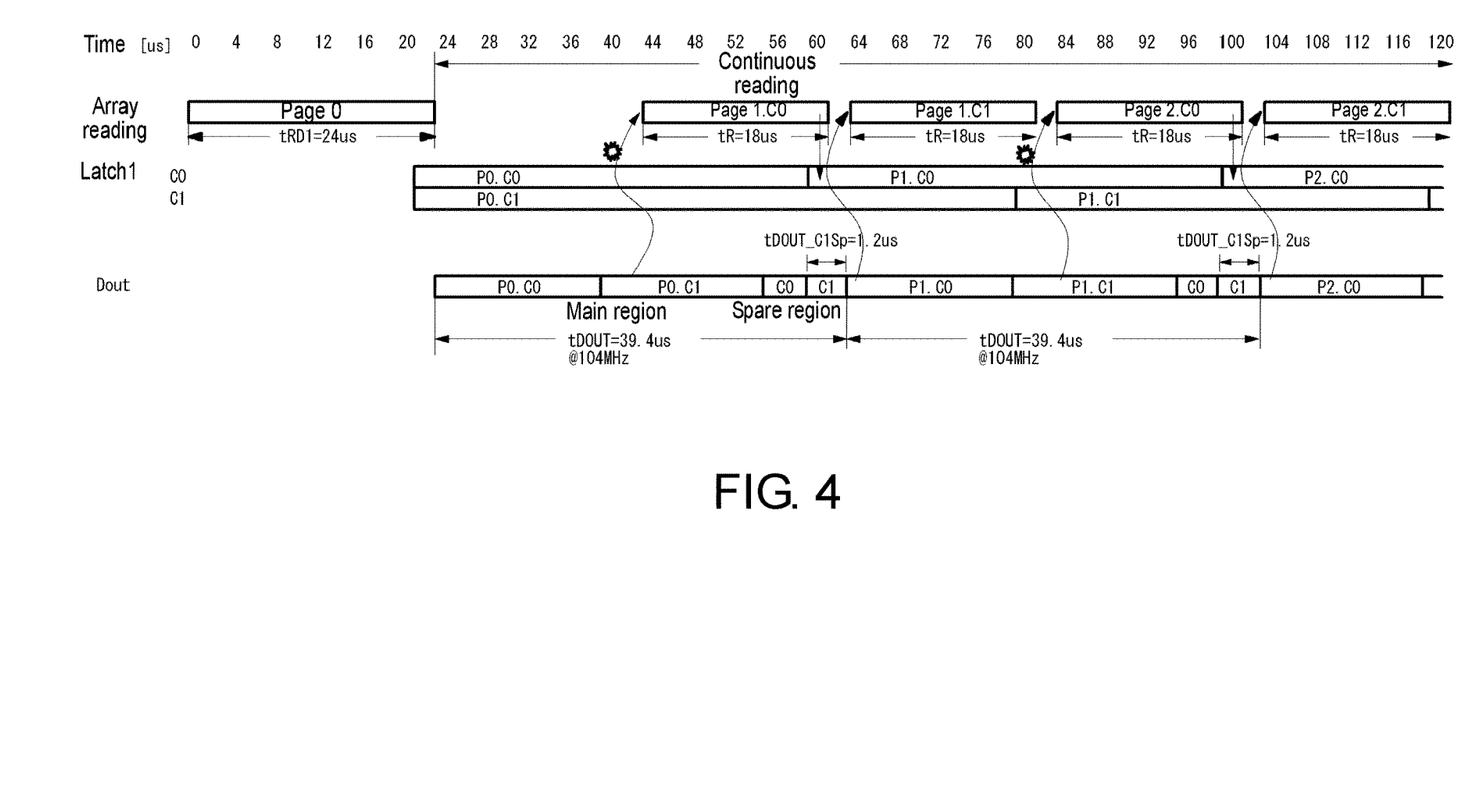
FIG. 4 is a timing diagram of another previous continuous reading performed by using the latch L1.

FIG. 4 is a timing diagram of performing reading of ½ pages of the cache memory C0 and the cache memory C1 (twice array reading) in a continuous reading operation. When the cache memory C0 of a selected page of the memory cell array is read, as shown in FIG. 1B, the main part C0_M and the spare part C0_S are read, and the data is transmitted to the latch L1, and when the cache memory C1 is read, the main part C1_M and the spare part C1_S are read, and the data is transmitted to the latch L1.

Therefore, data transmission of the cache memory C0 of the next page P1 must be after the output of the cache memory C0 of the page P0 of the latch L1. If the data transmission of the cache memory C0 of the page P1 is performed before that, the cache memory C0 of the page P0 is overwritten. The data output of the cache memory C0 is completed when the spare part C0_S of the cache memory C0 is output, in other word, if the data transmission of the cache memory C0 of the page P1 is not performed in the data output of the spare part C1_S of the cache memory C1, the data of the page P1 cannot be seamlessly output. However, a data output time tDOUT_C1Sp of the spare part C1_S of the cache memory C1 is about 1.2 µs, and in such a short period, in order to carry out the data transmission of the cache memory C0 of the next page, strict timing adjustment is required, which is difficult to achieve.

SUMMARY

The disclosure is directed to a semiconductor device and a continuous reading method capable of performing continuous reading while reducing a scale of a page buffer/sensing circuit.

The disclosure provides a continuous reading method of a flash memory including following steps. After outputting first page data held in a first cache memory of a latch of a page buffer/sensing circuit, the first page data of a next page is read from a memory cell array, and the read first page data is held in the latch. After outputting second page data held in a second cache memory of the latch, the second page data of the next page is read from the memory cell array, and the read second page data is held in the latch.

The disclosure provides a semiconductor device including: a memory cell array; a page buffer/sensing circuit, connected to each of bit lines of the memory cell array; a reading component, reading a selected page of the memory cell array; and an output component, outputting data read by the reading component, wherein when the reading component performs continuous reading of a plurality of pages, after the output component outputs first page data held in a first cache memory held of a latch of the page buffer/sensing circuit, the first page data of a next page is read from the memory cell array, and the read first page data is held in the latch, and after the output component outputs second page data held in a second cache memory of the latch, the second page data of the next page is read from the memory cell array, and the read second page data is held in the latch.

According to the disclosure, after the first page data is output, the first page data of the next page is read from the memory cell array, and the read first page data is held in the latch; after the second page data is output, the second page data of the next page is read from the memory cell array, and the read second page data is held in the latch, so that continuous reading may be performed while reducing a circuit scale of the page buffer/sensing circuit.

DESCRIPTION OF THE EMBODIMENTS

The embodiments of the disclosure will be described in detail with reference to the drawings. The semiconductor device of the disclosure is, for example, a NAND flash memory or a microprocessor, a microcontroller, a logic, an application specific integrated circuits (ASIC), a processor adapted to process images or sound, or a processor adapted to process signals such as wireless signals, etc., that is embedded in such flash memory.

Figure 5:
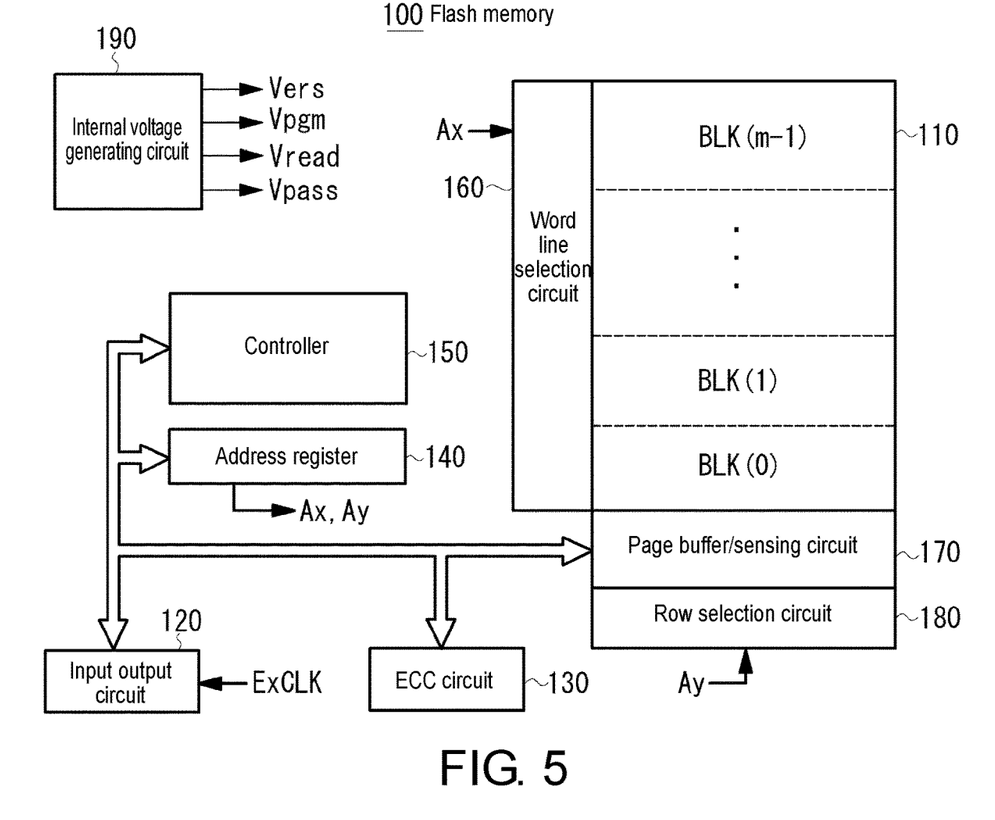
FIG. 5 is a diagram showing a configuration of a flash memory according to an embodiment of the disclosure.

FIG. 5 is a diagram showing a configuration of a flash memory according to an embodiment of the disclosure. A flash memory 100 of the embodiment includes: a memory cell array 110, having a plurality of memory cells arranged in a matrix; an input output circuit 120, adapted to output data to the outside or input data input from the outside in response to an external clock signal ExCLK; an ECC circuit 130, adapted to perform error detection and correction of data; an address register 140, receiving address data through the input output circuit 120; a controller 150, controlling each part based on a command received through the input output circuit 120 or a control signal applied to an external terminal; a word line selection circuit 160, receiving row address information Ax from the address register 140, decoding the row address information Ax, and performing block selection and word line selection, etc., based on a decoding result; a page buffer/sensing circuit 170, holding data read from a page selected by the word line selection circuit 160 or holding data to be programmed to the selected page; a row selection circuit 180, receiving column address information Ay from the address register 140, decoding the column address information Ay, and performing row selection in the page buffer/sensing circuit 170 based on a decoding result; and an internal voltage generating circuit 190, generating various voltages (a programming voltage Vpgm, a pass voltage Vpass, a reading pass voltage Vread, an erasing voltage Vers, etc.) required for reading, programming, erasing, etc., of data.

The memory cell array 110, for example, has m memory blocks BLK(0), BLK(1), . . . , BLK(m-1) arranged in a column direction. A plurality of NAND strings are formed in one memory block, and the NAND strings are formed by connecting a plurality of memory cells in series. The NAND strings may be formed on a substrate surface either in a two-dimensional manner or a three-dimensional manner. Moreover, the memory cell may be either a single level cell (SLC) type storing one bit (binary data) or a multi level cell (MLC) type storing multiple bits. One NAND string is formed by serially connecting a plurality of memory cells (for example, 64 memory cells), a bit line side selection transistor (selection gate line), and a source line side selection transistor (selection gate line). A drain of the bit line side selection transistor is connected to a corresponding bit line GBL, and a source of the source line side selection transistor is connected to a common source line.

In a reading operation of the flash memory 100, a certain positive voltage is applied to the bit lines, a certain voltage (for example, 0 V) is applied to the selected word line, a pass voltage Vpass (for example, 4.5 V) is applied to the non-selected word lines, and a positive voltage (for example, 4.5 V) is applied to the selection gate line and the selection gate line to turn on the bit line side selection transistor and the source line side selection transistor of the NAND string, and 0 V is applied to the common source line. In a programming (writing) operation, a high-voltage programming voltage Vpgm (15 V to 20 V) is applied to the selected word line, and an intermediate potential (for example, 10 V) is applied to the non-selected word lines to turn on the bit line side selection transistor and turn off the source line side selection transistor, and a potential corresponding to data "0" or "1" is supplied to the bit line. In an erasing operation, 0 V is applied to the selected word line in the block, and a high voltage (for example, 20 V) is applied to a P-well (well) to extract electrons of a floating gate to the substrate, so as to erase data in a unit of block.

Figure 6A:
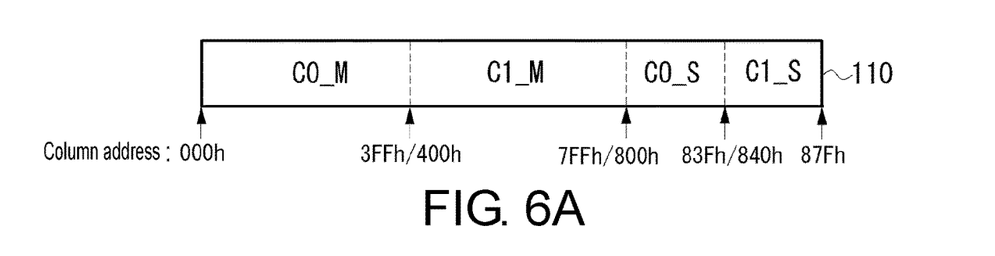
FIG. 6A and FIG. 6B are diagrams explaining definitions of a cache memory C0 and a cache memory C1 according to an embodiment of the disclosure.
Figure 6B:
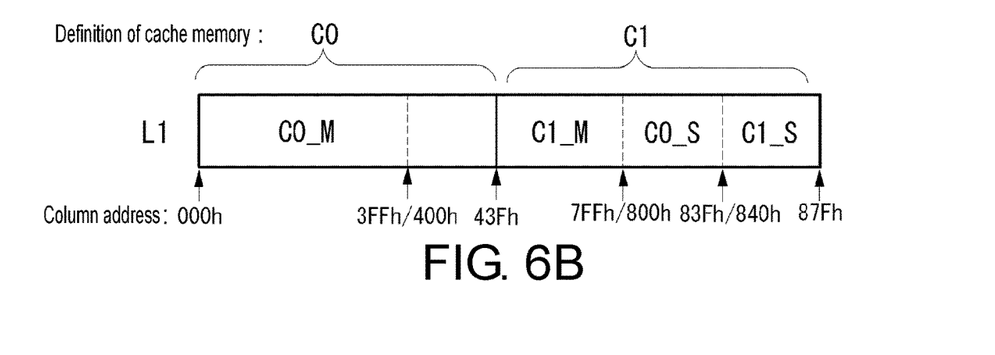

The page buffer/sensing circuit 170 includes a single latch L1 other than including two latches L1 and L2 as shown in FIG. 1A and FIG. 1B. In addition, it should be noted that in an internal operation of the flash memory 100, a cache memory C0 and a cache memory C1 are defined by ½ pages of continuous column addresses. FIG. 6A illustrates a configuration of a main region and a spare region on the memory cell array, and FIG. 6B illustrates definitions of the internal cache memory C0 and the cache memory C1.

The main region includes a main part C0_M corresponding to the cache memory C0 and a main part C1_M corresponding to the cache memory C1, column addresses of the main part C0_M are 000h-3FFh, and column addresses of the main part C1_M are 400h-7FFh. The spare region includes a spare part C0_S corresponding to the cache memory C0 and a spare part C1_S corresponding to the cache memory C1, column addresses of the spare part C0_S are 800h-83Fh, and column addresses of the spare part C1_S are 840h-87Fh.

In the internal operation of the flash memory 100, the cache memory C0 is defined as column addresses 000h-43Fh, and the cache memory C1 is defined as column addresses 440h-87Fh. Therefore, the cache memory C0 includes the main part C0_M and a part of the main part C1_M. The cache memory C1 includes a part of the main part C1_M, the spare part C0_S and the spare part C1_S. On the other hand, in terms of user definition, the cache memory C0 includes the main part C0_M and the spare part C0_S, and the cache memory C1 includes the main part C1_M and the spare part C1_S.

The data read from the selected page of the memory cell array is sensed by a sensing node of the page buffer/sensing circuit 170, and the sensed data is transmitted to the latch L1 and held by the latch L1. In the continuous reading operation, reading of the same page is performed twice, where the data of the cache memory C0 is read first, and is transmitted to the column addresses 000h-43Fh of the latch L1, and then the data of the cache memory C1 is read, and is transmitted to the column addresses 440h-87Fh of the latch L1. The cache memory C0 and the cache memory C1 of the latch L1 may respectively perform independent operations. Namely, in the continuous reading operation, reading from the array and output of data are independently performed in a unit of ½ pages. The array reading is performed based on an internal clock signal, and the data transmission between the latch L1 and the input output circuit 120 and the data output from the input output circuit 120 are performed based on the external clock signal ExCLK.

The row selection circuit 180 selects a start reading position of data in a page according to the input column address information Ay, or automatically reads the data from the beginning of the page without using the column address. Furthermore, the row selection circuit 180 may include a column address counter that increases the column address in response to a clock signal.

Figure 7:
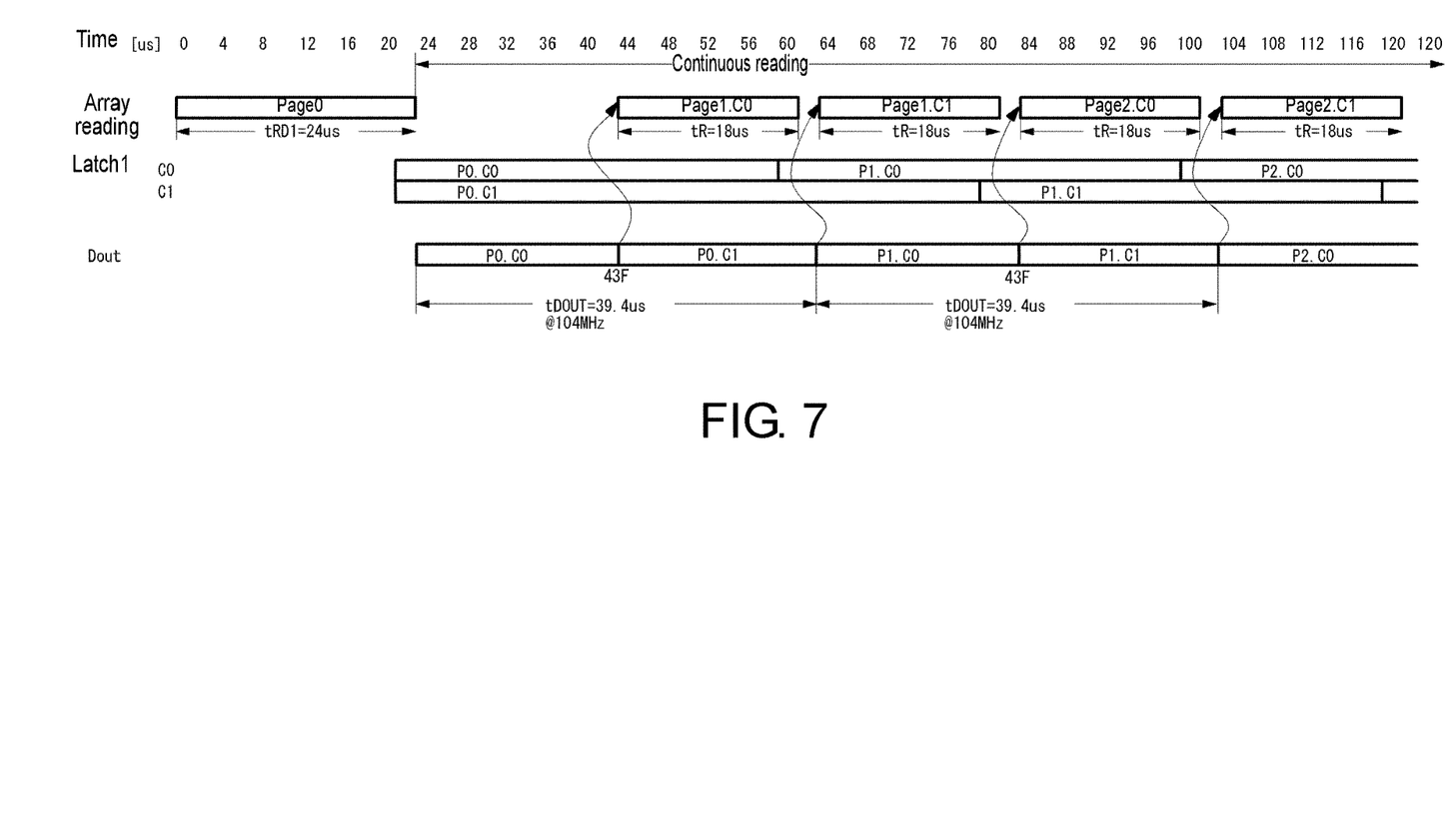
FIG. 7 is a timing diagram of a continuous reading operation according to an embodiment of the disclosure.

Then, the continuous reading operation of the flash memory 100 of the embodiment is described below. For example, the continuous reading operation is performed in a flash memory equipped with a serial peripheral interface (SPI) function. FIG. 7 is a timing diagram of the continuous reading operation of the embodiment. As shown in FIG. 7, after data of the cache memory C0 of a page P0 is output, in the data output of the cache memory C1 of the page P0, array reading of the cache memory C0 of the next page P1 is performed, and the read data of the cache memory C0 is transmitted to the latch L1. When the output of the data held in the latch L1 reaches the column address 43F, the controller 150 starts the array reading of the cache memory C0.

Then, after data of the cache memory C1 of the page P0 is output, in the data output of the cache memory C0 of the page P1, the page 1 is again selected to transmit the data of the cache memory C1 of the page P1 to the latch L1. When the output of the data held in the latch L1 reaches the column address 87F, the controller 150 starts the array reading of the cache memory C1.

In this way, in the embodiment, in the output of the cache memory C1 of the latch L1, the data of the cache memory C0 of the next page is read into the latch L1, and in the output of the cache memory C0, the data of the cache memory C1 of the next page is read to the latch L1. As a result, even if the high frequency external clock signal ExCLK is used, it is easy to satisfy that the data output time tDOUT of the cache memory of ½ page is greater than the array reading time tR of ½ page, so that seamless data output of multiple pages may be performed.

Figure 8A:
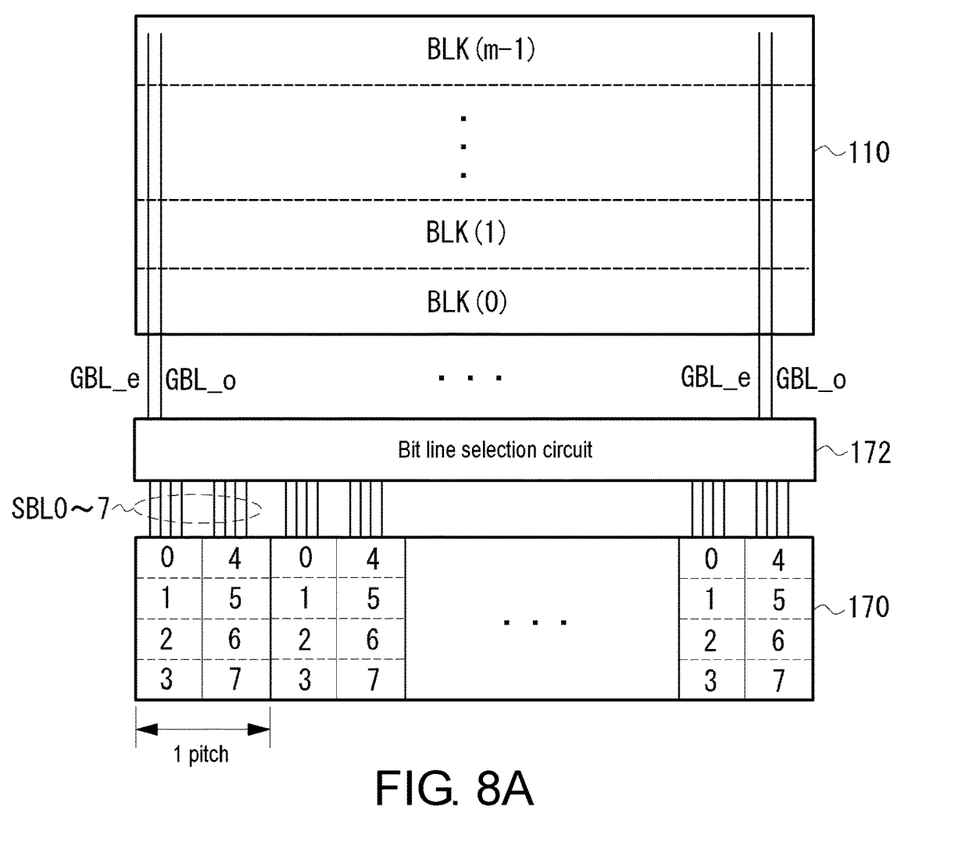
FIG. 8A and FIG. 8B illustrate a layout of page buffers/sensing circuits according to an embodiment of the disclosure.
Figure 8B:
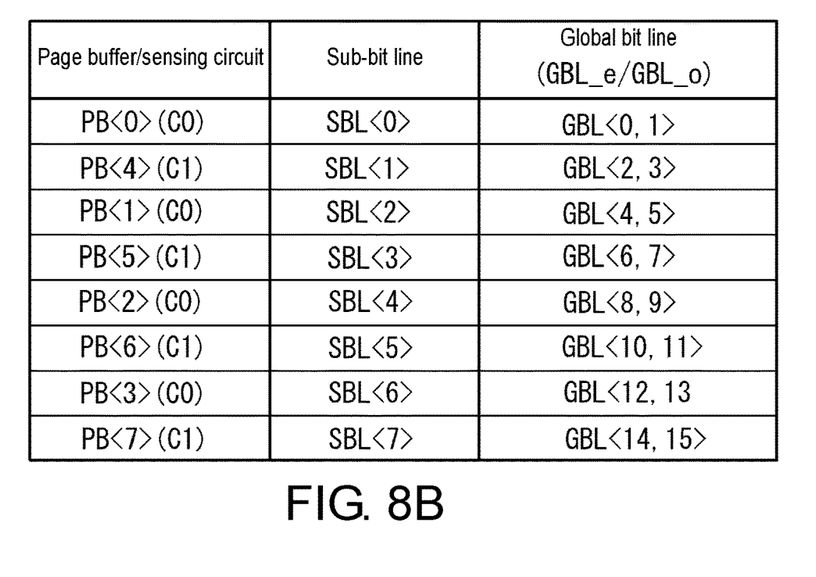
Figure 9:
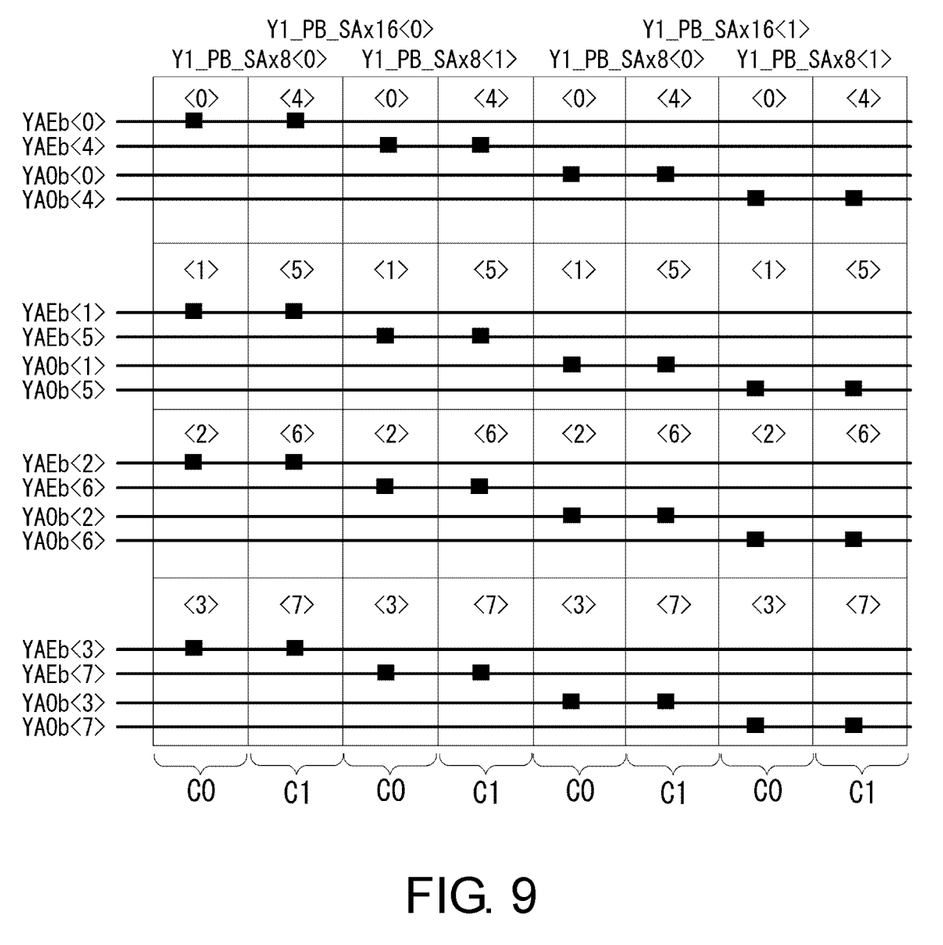
FIG. 9 is a diagram of a selection of the page buffers/sensing circuits in a row direction when the cache memory C0 and the cache memory C1 of the embodiment are read.

Then, FIG. 8A is a schematic layout of the page buffer/sensing circuit 170 of the embodiment. FIG. 8B is a table showing a connection relationship of page buffers/sensing circuits PB<0> to <7>, sub-bit lines SBL<0> to <7>, and global bit lines GBL<0> to <15>. As shown in FIG. 8A, the page buffer/sensing circuit 170 is configured to be 2 columns×4 segments within one pitch of a row direction. One page buffer/sensing circuit is composed of a sensing circuit and a latch circuit. A sub-bit line SBL connected to a sensing node of a page buffer/sensing circuit is connected to an even-numbered global bit line GBL_e and an odd-numbered global bit line GBL_o through a bit line selection circuit 172. The even-numbered global bit lines GBL_e and the odd-numbered global bit lines GBL_o extend in the column direction on a plurality of blocks of the memory cell array 110. Therefore, within one pitch, 8 sub-bit lines are laid out, and 8 page buffers/sensing circuits 170 connected to the 8 sub-bit lines are configured, where the 8 sub-bit lines are connected to 16 even-numbered global bit lines GBL_e and odd-numbered global bit lines GBL_o through the bit line selection circuit 172. By arranging the page buffers/sensing circuits into 2 columns×4 segments, the number of segments of the page buffer/sensing circuit 170 in the column direction is reduced, so that area efficiency is improved. Further, in the embodiment, since the page buffer/sensing circuit 170 does not include a plurality of the latches L1 and L2, a size thereof in a height direction may be reduced. Moreover, in the continuous reading operation, when the cache memory C0 is read, any one of the even-numbered global bit lines GBL_e or the odd-numbered global bit lines GBL_o corresponding to the sub-bit lines SBL<0, 2, 4, 6> connected to the page buffer/sense circuits PB<0> to <3> is read, and when the cache memory C1 is read, any one of the even-numbered global bit lines GBL_e or the odd-numbered global bit lines GBL_o corresponding to the sub-bit lines SBL<1, 3, 5, 7> connected to the page buffer/sense circuits PB<4> to <7> is read. At this time, the non-selected even global bit lines or odd global bit lines are electrically connected to GND to perform mask reading.

Figures 10A, 10B:
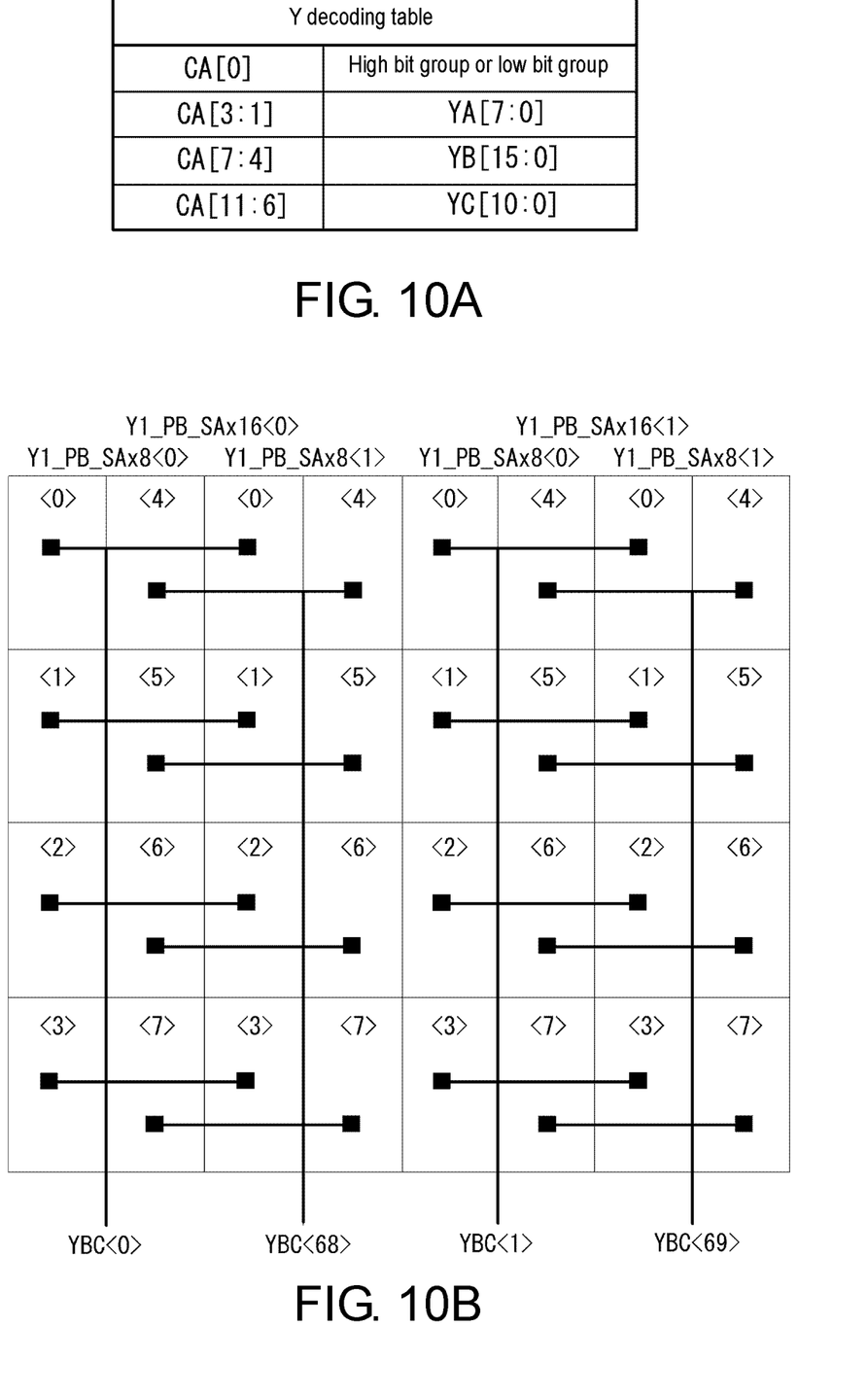
FIG. 10A and FIG. 10B are diagrams of a selection of the page buffers/sensing circuits in a column direction when the cache memory C0 and the cache memory C1 of the embodiment are read.
Figure 11:
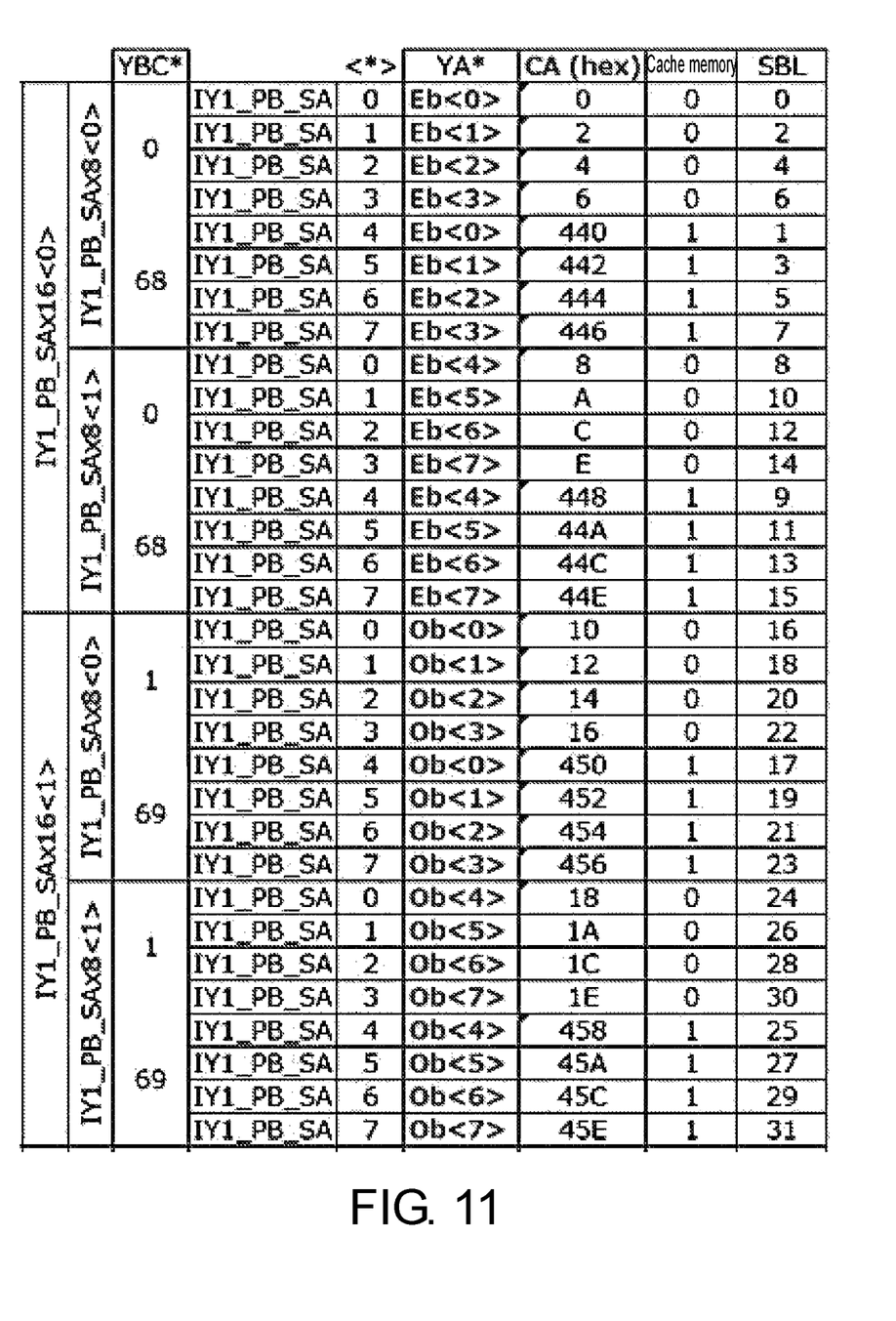
FIG. 11 is a table of the selected page buffers/sensing circuits when the cache memory C0 and the cache memory C1 of the embodiment are read.

FIG. 9, FIG. 10A and FIG. 10B, FIG. 11 respectively show a connection relationship between the cache memory C0, the cache memory C1 and the page buffers/sensing circuits (sub-bit lines) shown in FIG. 8A and FIG. 8B. In the figures, Y1_PB_SA×8<0> and Y1_PB_SA×8<1> represent layouts of eight page buffers/sensing circuits. A YAEb<*> signal, a YAOb<*> signal, and a YBC<*> signal are selection signals generated by decoding column addresses by the row selection circuit 180. FIG. 10A shows a decoding table of the column address CA.

When reading of the cache memory C0 and the cache memory C1 is performed, the corresponding page buffer/sensing circuit 170 is selected by YBC<*>. In FIG. 10B, YBC<0> to YBC<67> select the page buffers/sensing circuits PB<0> to <3> when the cache memory C0 is read, and YBC<68> to YBC<135> select the page buffers/sensing circuits PB<4> to <7> when the cache memory C1 is read. YBC[0, 68], YBC[1, 69], . . . YBC[67, 135] are cache memory C0 and cache memory C1 pairs in the page buffers/sensing circuits of Y1_PB_SA×8. In this way, in the reading operation of the cache memory C0 and the cache memory C1, by alternately arranging the activated page buffers/sensing circuits in the column direction and the non-activated page buffers/sensing circuits in the column direction, the physically separated cache memory C0 and cache memory C1 shown in FIG. 6B are connected, and since the activated page buffers/sensing circuits are physically separated (due to intervening of the non-activated page buffers/sensing circuits), the bit lines selected at the same time in the cache memory C0 or the cache memory C1 may be separated, thereby suppressing an influence of capacitive coupling between the page buffers/sensing circuits and between the bit lines when the same page is repeatedly read.

The preferred embodiments of the disclosure have been described in detail, but the disclosure is not limited to specific embodiments, and various modifications and changes can be made within the scope of the disclosure described in the claims.

What is claimed is:

1. A continuous reading method, comprising the following steps:
after outputting first page data held in a first cache memory of a latch of a page buffer/sensing circuit, reading the first page data of a next page from a memory cell array, and holding the read first page data in the latch; and
after outputting second page data held in a second cache memory of the latch, reading the second page data of the next page from the memory cell array, and holding the read second page data in the latch,
wherein the first page data and the second page data each is data of continuous ½ pages in a column address direction of a selected page of the memory cell array.

2. The continuous reading method as claimed in claim 1, wherein after outputting the first page data held in the first cache memory, the second page data held in the second cache memory is continuously output.

3. The continuous reading method as claimed in claim 1, wherein the first page data comprises data of a main region for storing data, and the second page data comprises data of the main region and data of a spare region.

4. The continuous reading method as claimed in claim 1, wherein when the first page data is read, m bit lines of a first group is selected, when the second page data is read, m second bit lines of a second group is selected, and the bit lines of the first group and the bit lines of the second group are alternately arranged.

5. The continuous reading method as claimed in claim 1, wherein the first page data and the second page data held in the first cache memory and the second cache memory are output externally in synchronization with a clock signal.

6. A semiconductor device, comprising:
a memory cell array;
a page buffer/sensing circuit, connected to each of bit lines of the memory cell array;
a reading component, reading a selected page of the memory cell array; and
an output component, outputting data read by the reading component, wherein
when the reading component performs continuous reading of a plurality of pages, after the output component outputs first page data held in a first cache memory of a latch of the page buffer/sensing circuit, the first page data of a next page is read from the memory cell array, and the read first page data is held in the latch, and after the output component outputs second page data held in a second cache memory of the latch, the second page data of the next page is read from the memory cell array, and the read second page data is held in the latch,
wherein the first page data and the second page data each is data of continuous ½ pages in a column address direction of a selected page of the memory cell array.

7. The semiconductor device as claimed in claim 6, wherein after the output component outputs the first page data held in the first cache memory, the output component continuously outputs the second page data held in the second cache memory.

8. The semiconductor device as claimed in claim 6, wherein the first page data comprises data of a main region for storing data, and the second page data comprises data of the main region and data of a spare region.

9. The semiconductor device as claimed in claim 6, wherein the reading component selects m bit lines of a first group when reading the first page data, and selects in bit lines of a second group when reading the second page data, wherein the bit lines of the first group and the bit lines of the second group are alternately arranged.

10. The semiconductor device as claimed in claim 6, wherein the output component outputs the first page data and the second page data held in the first cache memory and the second cache memory externally in synchronization with a clock signal.

* * * * *